United States Patent
Coleman

(10) Patent No.: US 7,286,581 B2
(45) Date of Patent: Oct. 23, 2007

(54) SELF-MONITORING LIGHT EMITTING APPARATUS

(75) Inventor: Christopher L. Coleman, Santa Clara, CA (US)

(73) Assignee: Avago Technologies Fiber IP (Singapore) Pte Ltd, Singapore (SG)

( * ) Notice: Subject to any disclaimer, the term of this patent is extended or adjusted under 35 U.S.C. 154(b) by 271 days.

(21) Appl. No.: 10/923,074

(22) Filed: Aug. 20, 2004

(65) Prior Publication Data

US 2006/0039434 A1  Feb. 23, 2006

(51) Int. Cl.
*H01S 5/00* (2006.01)

(52) U.S. Cl. .................... 372/21; 372/50.124

(58) Field of Classification Search ........... 372/50.1, 372/50.124, 50.23, 50.21, 108
See application file for complete search history.

(56) References Cited

U.S. PATENT DOCUMENTS

| 5,809,050 A | * | 9/1998 | Baldwin et al. ......... 372/50.21 |
| 5,812,581 A | | 9/1998 | Cox |
| 6,111,903 A | * | 8/2000 | Isaksson et al. ......... 372/50.21 |
| 6,636,540 B2 | | 10/2003 | Uebbing |
| 6,717,972 B2 | * | 4/2004 | Steinle et al. ............ 372/50.21 |
| 2004/0052463 A1 | | 3/2004 | Chen |

FOREIGN PATENT DOCUMENTS

DE  100 04 398  8/2001

OTHER PUBLICATIONS

German Office Action dated Mar. 5, 2007 involving counterpart German Patent Application No. 10 2005 016 052.2-54.
English translation of German Office Action dated Apr. 11, 2007 involving counterpart German Patent Application No. 10 2005 016 052.2-54.

* cited by examiner

*Primary Examiner*—Armando Rodriuez

(57) ABSTRACT

A self-monitoring light source is provided. The self-monitoring light source includes a light source that generates light and a light monitor that receives a portion of the generated light. The light source and the light monitor are manufactured on the same semiconductor die.

13 Claims, 14 Drawing Sheets

2

SELF-MONITORING LIGHT EMITTING APPARATUS

BACKGROUND OF THE INVENTION

Semiconductor lasers are used as components in many optical systems. A Vertical Cavity Surface Emitting Laser (VCSEL) is one type of semiconductor laser. Because the VCSEL can be manufactured and tested less expensively than other semiconductor lasers, the VCSEL is often a preferred light source in many applications. Like other semiconductor lasers, however, the output power of a VCSEL changes or varies with temperature and time as the VCSEL ages.

One approach to maintain a steady or constant output power for the VCSEL is to monitor the VCSEL's light output. A portion of the VCSEL's light output is typically diverted in a feedback loop onto a monitoring device, such as a photodiode. When the VCSEL's output power varies, the feedback circuitry adjusts the drive current provided to the VCSEL, which in turn, compensates the output power generated by the VCSEL. A partially transmitting mirror, also known as a window-mirror, is commonly used to divert a portion of the VCSEL light output onto the photodiode.

One prior art technique to monitor the power emitted by a vertical cavity surface emitting laser (VCSEL) is to utilize an external optical surface to split a fraction of the emitted laser power and to re-direct it onto a separate photodetector device. U.S. Pat. No. 6,636,540, entitled "Optical turn for monitoring light from a laser," describes an example of this approach. Although a significant improvement over the approaches existing at that time, such a solution requires separate optics and detector components to realize the power monitoring.

In most prior art systems, there are at least the following separate components: a VCSEL component, a photo detector component and optics. As can be appreciated, the optical component, laser component, and detector component must be carefully assembled and integrated to produce a working system. Furthermore, it is recognized in the art that integrating the optics component with the other components requires complex system integration. This system integration can include alignment, complicated assembly steps, and packaging methods. Moreover, the number of separate pieces or components undesirably increases the overall package size. Furthermore, different product platforms each require a specific design to integrate the separate optical components, laser component, and detector component.

Based on the foregoing, there remains a need for a system and method for integrating a light emitting device and a power monitor that overcomes the disadvantages set forth previously.

SUMMARY OF THE INVENTION

According to one embodiment of the present invention, a self-monitoring light emitting apparatus (e.g., a light source) that is manufactured as a single semiconductor die is described. The self-monitoring light source includes a light source that generates light and a light monitor that receives a portion of the generated light. The light source (e.g., a vertical emitting light source) and the light monitor are manufactured on the same semiconductor die. In this embodiment, optics can be integrated in the semiconductor die or provided as an element separate from the semiconductor die.

According to one embodiment of the present invention, a self-monitoring light emitting apparatus (e.g., light source) that is manufactured as a single sub-assembly of a light source die and a monitor die is described. The self-monitoring light source includes a light source (e.g., a vertical emitting light source) that is formed in a light source die and a monitor or detector that is formed in a monitor die. The light source die and monitor die are combined or packaged into a single sub-assembly. In this embodiment, the optics can be formed in the light source die or formed in the monitor die.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A self-monitoring light emitting apparatus is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Optical System 100

Figure 1:
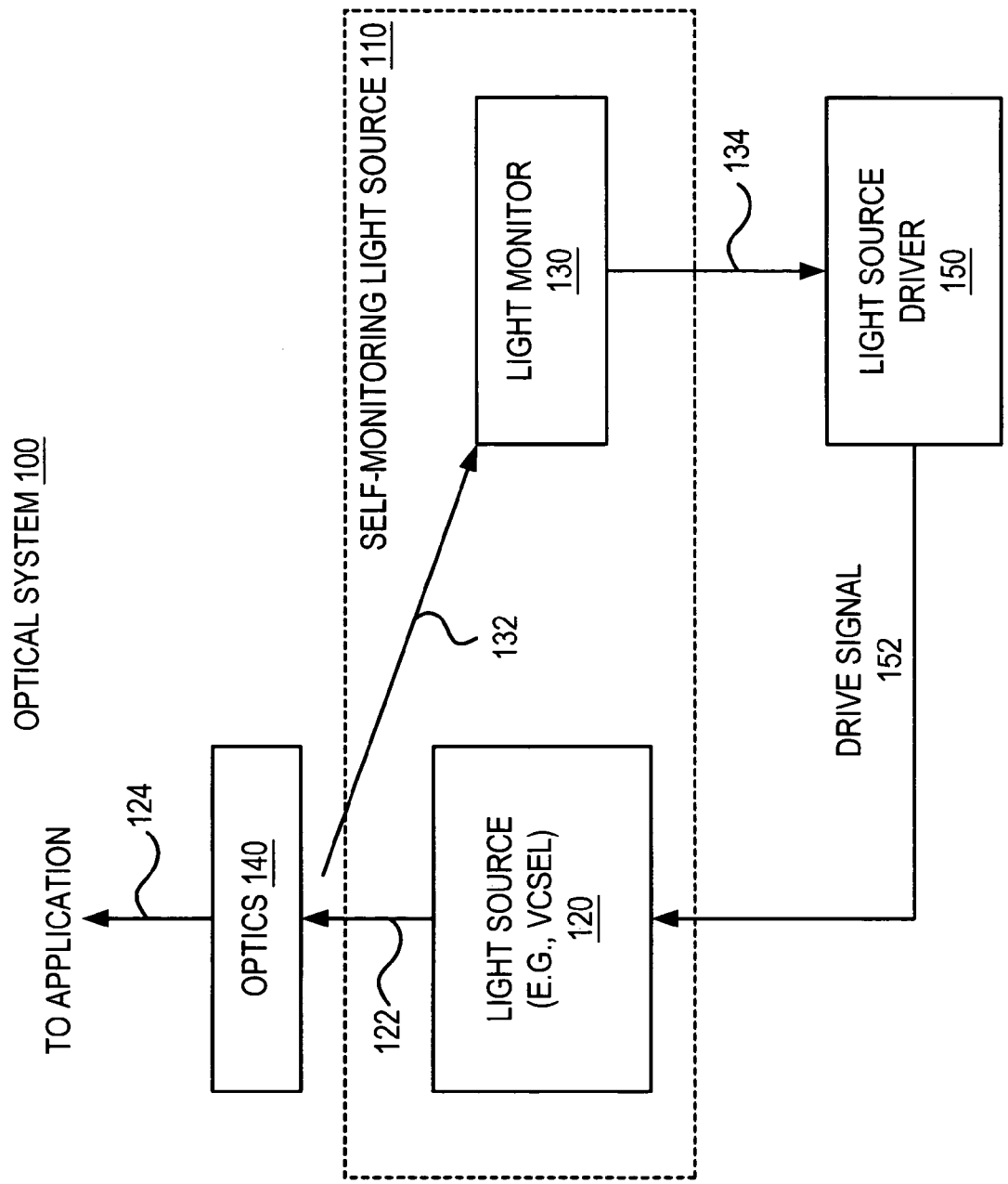
FIG. 1 illustrates an optical system that incorporates a self-monitoring light source according to one embodiment of the invention.

FIG. 1 illustrates an optical system 100 that incorporates a self-monitoring light source 110 according to one embodiment of the invention. The optical system 100 can be, for example, an optical transmitter that receives a data signal, modulates a light source based on the data signal, and launches the modulated light into an optical medium, such as a fiber optic cable.

The optical system 100 includes self-monitoring light source 110, optics 140, and a light source driver 150 that provides a drive signal 152 (e.g., drive current) to the light source 110 (e.g., laser). The self-monitoring light source 110 includes a light monitor 130 that receives a portion of the light generated by the laser and based thereon generates a feedback signal and provides the feedback signal to the laser driver. The light monitor 130 measures the amount of light generated by the light source or the amount of power generated thereby. The light monitor 130 can be, for example, a light detector and is referred to herein also as "power monitor," "power detector," "monitor," or "detector."

Self-Monitoring Light Source 110

The optical system 100 includes a self-monitoring light source 110 (hereinafter also referred to as self-monitoring light emitting apparatus or device 110) according to one embodiment of the invention. The self-monitoring light source 110 includes a light source 120, which in one embodiment, is a semiconductor laser (e.g., a VCSEL) and a light monitor 130 (e.g., a photodetector or phototransistor) that is integrated with the light source 120.

The light source 120 generates light 122 that is directed to the optics 140. A first portion 124 of the light 122 is transmitted to an application, and a second portion 132 of the light 122 is reflected by the optics 140 to the light monitor 130. In this embodiment, the self-monitoring light source 110 employs external optics 140. For example, the self-monitoring light source 110 can be assembled or packaged with external optics. The external optics 140 are utilized to transmit a portion of the light generated by the laser 120 and to reflect back a portion to the monitor 130. The optics 140 can include a partially transmitting mirror, also known as a window-mirror, to divert a portion 132 of the VCSEL light output 122 onto the light monitor 130.

The light monitor 130 measures the second portion 132 of light and provides a feedback signal 134 to a light source driver 150 (e.g., a laser driver circuit). The signal 134 can represent a measure of the output power of the light source 120. The light source driver 150 receives the feedback signal 134 and other signals (e.g., data signals) and based thereon provides one or more drive signals 152 (e.g., a drive current signal) to the light source 120.

As noted previously, the output power of the light source 120 (e.g., output of the VCSEL) changes or varies with temperature and with time (e.g., the age of the VCSEL). The light monitor 130 monitors the light output of the light source 120 (e.g., the VCSEL's light output). A portion 132 of the VCSEL's light output is typically diverted in a feedback loop onto the light monitor 130. When the VCSEL's output power 122 varies, the light source driver 150 adjusts the drive current 152 provided to the VCSEL, which in turn, compensates the output power 122 generated by the VCSEL 120. In this manner, the feedback loop of the monitor 130, light source driver 150, and light source 120 is utilized to control the output power for the light source 120. In one embodiment, the feedback is utilized to maintain a steady or constant output power for the light source 120.

In one embodiment, a light source (e.g., a vertical emitting light source or VCSEL) and a light monitor (e.g., a photodetector that measures or monitors the power generated by the laser) are integrated into a single semiconductor die (e.g., monolithic integration). In another embodiment, a light source, a light monitor, and an optical element (e.g., grating) is integrated into a single die. For example, a grating may be formed on a surface of the semiconductor die.

In yet another embodiment, a light source (e.g., a vertical emitting light source, such as a VCSEL) is formed in a light source die and a light monitor (e.g., a photo detector that measures or monitors the power generated by the laser) is formed in a monitor die or thin film, and the light source die and the monitor die are combined in a single sub-assembly. For example, the light source die and the monitor die can be assembled together or packaged together into a single sub-assembly. Separate optics external to the sub-assembly of the self-monitoring light source 110 may be utilized.

In yet another embodiment, the light source, light monitor, and optical element are combined in a single sub-assembly. In this embodiment, it is noted that the optics (e.g., a grating) may be formed in the light source die or formed in the monitor die.

In yet another embodiment, a light source is integrated with an optical element in a single die. In this embodiment, it is noted that the optics (e.g., a grating) may be formed on a surface of the light source die. The light source die with integrated optics can then be combined with a light monitor that is formed in either a light monitor die or a light monitor thin film.

In yet another embodiment, a light monitor is integrated with an optical element in a single die. In this embodiment, it is noted that the optics (e.g., a grating) may be formed on a surface of the light monitor die.

Optical System 200

Figure 2:
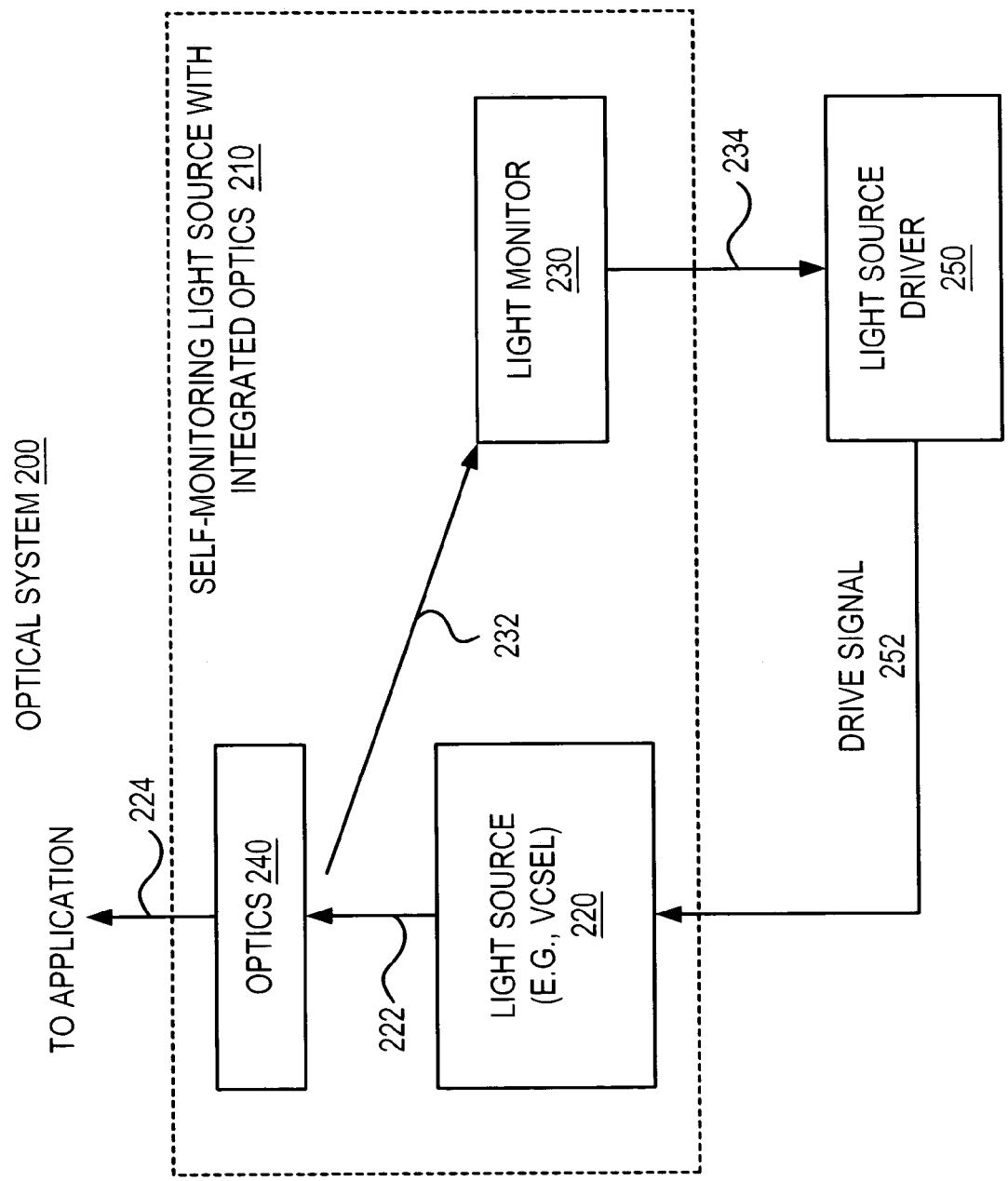
FIG. 2 illustrates an optical system that incorporates a self-monitoring light source with integrated optics according to another embodiment of the invention.

FIG. 2 illustrates an optical system 200 that incorporates a self-monitoring light source with integrated optics 210 according to one embodiment of the invention. The optical system 200 can be, for example, an optical transmitter that receives a data signal, modulates a light source based on the data signal, and launches the modulated light into an optical medium, such as a fiber optic cable.

Self-Monitoring Light Source 210 with Integrated Optics

The optical system 200 includes a self-monitoring light source 210 with integrated optics (hereinafter also referred to as self-monitoring light emitting device with integrated optics 210) according to one embodiment of the invention. The self-monitoring light source 210 includes a light source 220, which in one embodiment is a semiconductor laser (e.g., a VCSEL), a light monitor 230 that is integrated with the light source 220, and an optical element 240 that is integrated with the light source 220 and light monitor 230. In this embodiment, an external optical element is not required since an internal optical element 240 (e.g., a diffraction grating) is provided by the self-monitoring light source 210 to perform light direction, reflection, re-direction, etc.

Self-Monitoring Bottom-Surface Emitting VCSEL

Figure 3:
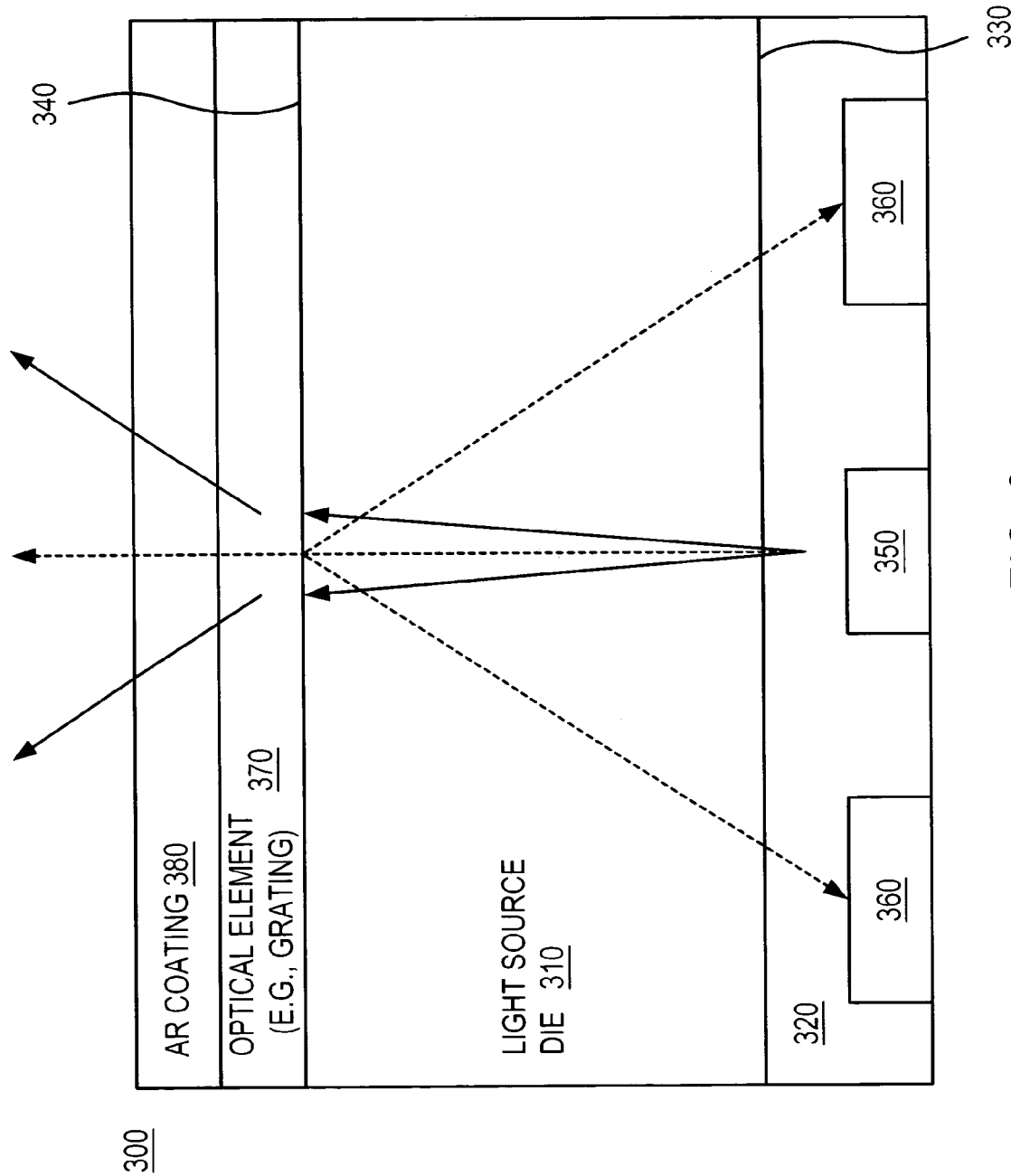
FIG. 3 illustrates a side view of a self-monitoring light source according to one embodiment of the invention.

FIG. 3 illustrates a side view of a self-monitoring light source 300 (hereinafter also referred to as a self-monitoring light emitting apparatus) according to one embodiment of the invention. In this embodiment, the self-monitoring light emitting apparatus 300 includes a light source 350, a light monitor 360, and optical element 370 all integrated in a single semiconductor die (also referred to herein as single chip or single die).

In this embodiment, the self-monitoring light source 300 includes a vertical emitting light source 350 (e.g., a vertical emitting semiconductor laser or bottom-surface emitting VCSEL). The light source 350 is integrated with a light monitor 360 and an optical element 370. Specifically, the light source 350, light monitor 360 and optical element 370 are formed or manufactured in a single semiconductor die 310 (also referred to herein as a light source die or laser die). The light source die 310 includes an active layer 320, where active elements are processed. The active layer 320 includes a laser aperture 350 and the light monitor 360 (e.g., a photo detector).

It is noted that the die 310 may be made from a semiconductor material, such as indium gallium arsenide (InGaAs) or other semiconductor material (e.g., II-VI and III-V semiconductors) known by those of ordinary skill in the art for manufacturing optical electronics. One method to integrate the monitor 360 (e.g., photo detector) into the laser die 310 (e.g., a VCSEL die) is to use a selective etch and epitaxial re-growth. First, the laser cavity is eliminated throughout the monitor region. Then, the removed portion is re-grown as a thicker absorption layer for increased efficiency.

The semiconductor die 310 includes a bottom surface 330 and a top surface 340. An optical element (e.g., a grating) 370 may be formed on the top surface 340. In one embodiment, the grating 370 (e.g., diffraction grating) is etched in the top surface of the semiconductor die 310. For example, the grating 370 can be formed or made by etching a surface relief pattern into the light source die 310 or substrate material. It is noted that the optical element 370 can be formed along the entire surface of the die 310 as shown or formed along only a portion of the surface of the die 310 (e.g., directly above the light source 350). As described in greater detail hereinafter, the grating may also be etched in a monitor die according to one embodiment of the invention. An anti-reflection (AR) layer 380 or coating may be formed on the grating 370. The AR layer 380 can be, for example, a silicon nitride layer or titanium dioxide layer.

In one embodiment, the layer 320 includes a semiconductor laser (e.g., a VCSEL) 350 and a monitor 360. For example, the laser 350 can be a bottom-surface emitting VCSEL. Light is generated at the laser aperture on the bottom surface 330, travels through the substrate 310, and illuminates the optical element 370 (e.g., diffraction grating) on the top surface. Light generated by the laser 350 can travel as a cone as illustrated by the exemplary light rays.

It is noted that a large portion of the light is transmitted out of the source 300 for a particular application (e.g., transmitter application), a portion of the light is reflected back to the monitor 360, and a portion of the light (not shown) may be reflected back to other regions of the active layer 320 (e.g., the laser 350). As noted previously, the portion of light reflected back to the monitor 360 is measured and provided to a driver circuit that adjusts the drive signal provided to the laser in order to compensate for variations in the output of the laser due to temperature and aging of the laser, for example.

Although the light source 350 is described in one embodiment as a VCSEL, it is noted that the teachings according to the invention can be applied to any vertical-emitting light sources that can include, but are not limited to, vertical emitting light emitting diodes (LEDs), vertical emitting semiconductor lasers, or other vertical emitting light sources.

Self-Monitoring Top-Surface Emitting VCSEL

Figure 4:
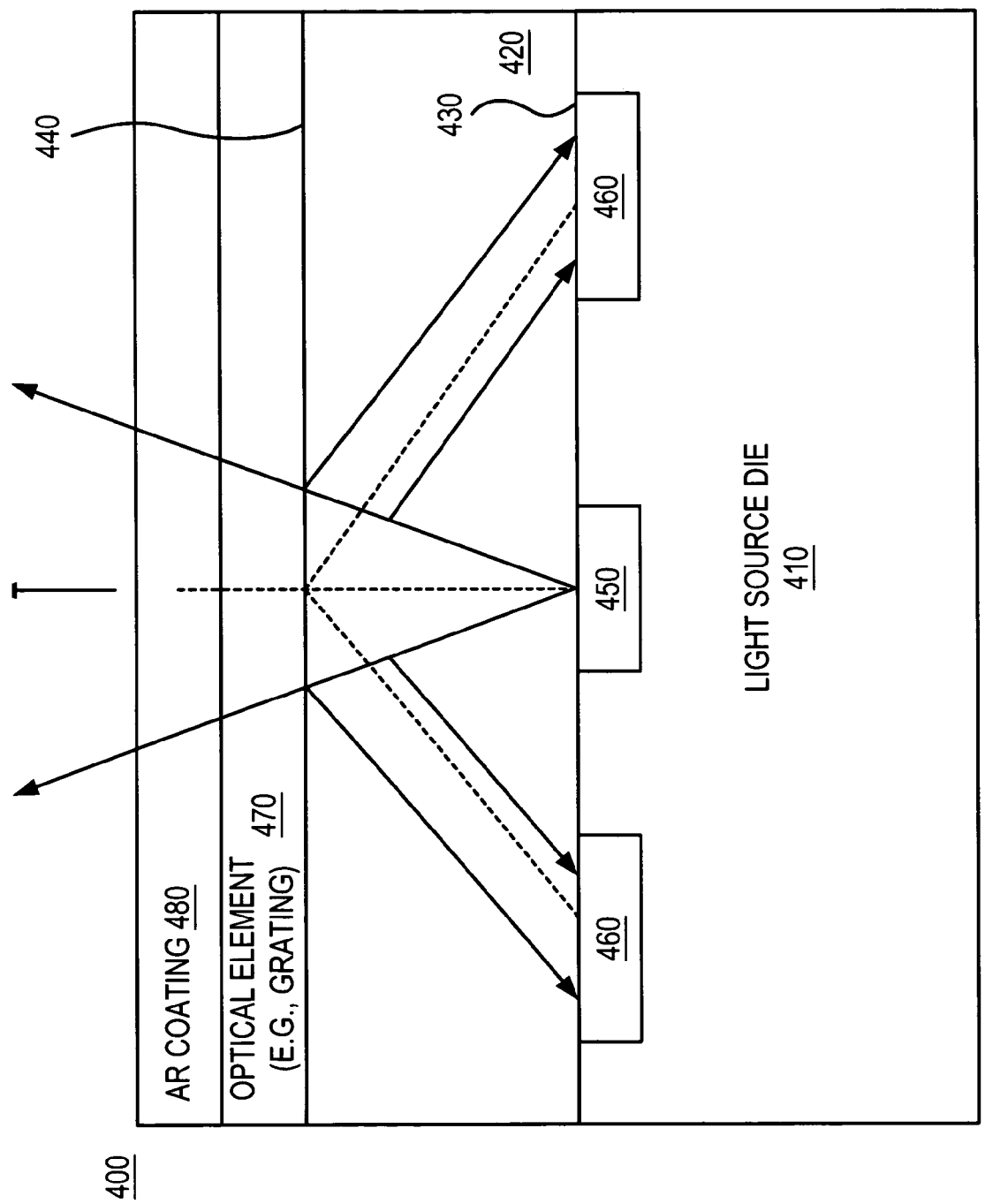
FIG. 4 illustrates a side view of a self-monitoring light source according to another embodiment of the invention.

FIG. 4 illustrates a side view of a self-monitoring light source 400 according to another embodiment of the invention. In this embodiment, the self-monitoring light source 400 is a self-monitoring top-surface emitting VCSEL. In this embodiment, the laser 450 is a top surface emitting VCSEL. The die 410 (hereinafter also referred to as a light source die) has formed thereon a layer 420 of transparent material. For example, the transparent material 420, such as epoxy, can be deposited on the top-surface 430 of the die 410.

An optical element is formed on a surface 440 of the transparent layer 420 or as part of the layer 420. In one embodiment, layer 420 is subsequently patterned with a grating 470 that is described in greater detail hereinafter with reference to FIGS. 9-14. Optionally, an AR coating 480 can be applied to the grating 470.

Exemplary Monitor Configurations: Exemplary Shapes and Geometries

Figure 5:
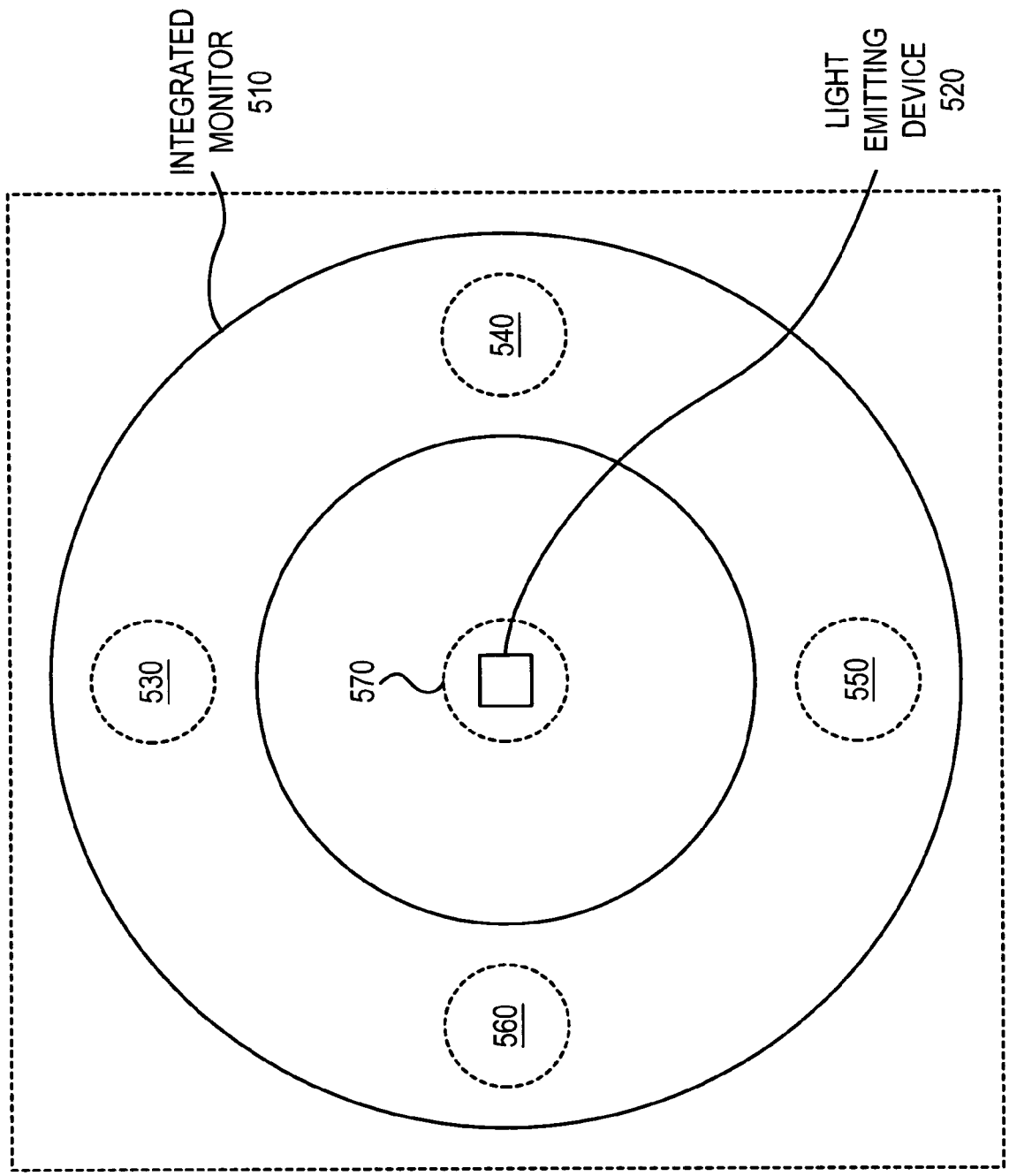
FIG. 5 illustrates a top view of a self-monitoring light source according to one embodiment of the invention in which the monitor has a layout with a ring geometry according to one embodiment of the invention.

FIG. 5 illustrates a top view of a self-monitoring light source, where the monitor includes a ring geometry according to one embodiment of the invention. In this embodiment, the monitor 510 has a layout that features a ring geometry (e.g., a ring-like shape). In one embodiment, the light monitor or photodetector partially surrounds the laser aperture on at least one plane or level. In another embodiment, the light monitor or photodetector completely surrounds the laser aperture on at least one plane or level. In yet another embodiment, the light monitor is disposed on a first plane; the light source is disposed on a second plane, and the light monitor or photodetector either partially surrounds or completely surrounds a projection of the laser aperture onto the plane of the light monitor.

The ring geometry is advantageous in that the alignment requirements of the mask for the grating and the components in the active layer are relaxed due to the symmetry of the ring shape. For example, even when the alignment between the grating and the laser is not perfect, the light reflected back is captured by the monitor because of the symmetry of the monitor geometry.

Figure 6:
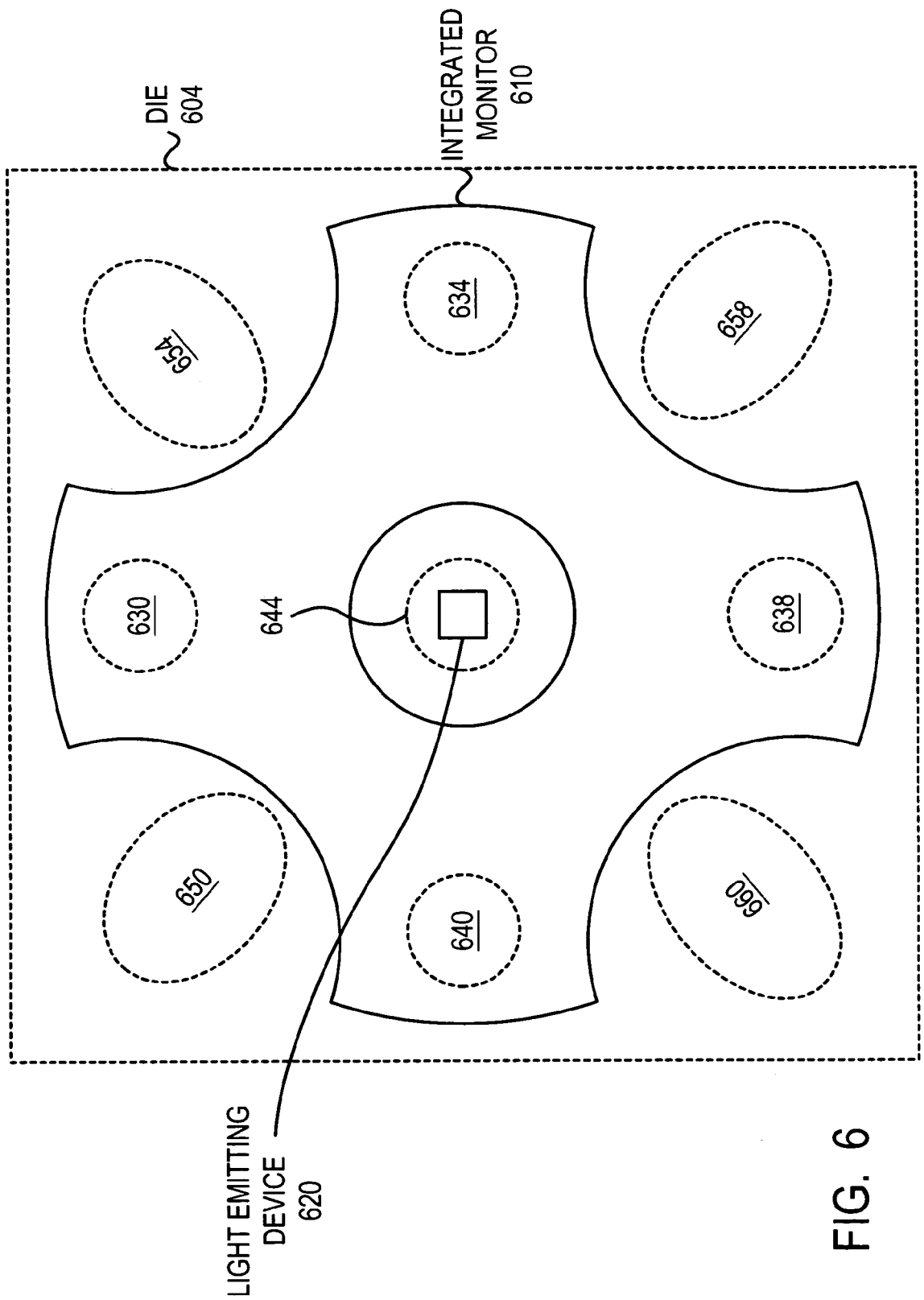
FIG. 6 illustrates a top view of a self-monitoring light source according to another embodiment of the invention in which the monitor has a layout with a ring geometry that feature cut-outs according to another embodiment of the invention.

FIG. 6 illustrates a top view of a self-monitoring light source, where the monitor includes a ring geometry with cutouts according to another embodiment of the invention. FIGS. 5 and 6 are discussed in greater detail hereinafter.

Figure 7:
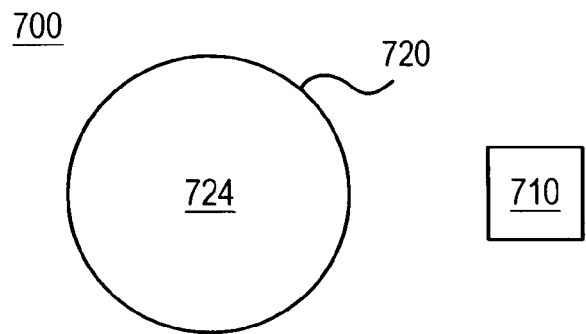
FIG. 7 illustrates a top view of a self-monitoring light source, in which the monitor utilizes a layout with a single light-receiving site according to one embodiment of the invention.

FIG. 7 illustrates a top view of a self-monitoring light source 700. The self-monitoring light source includes a light source 710 and a monitor 720 integrated therewith. In this embodiment, the light source 710 is a semiconductor laser (e.g., a VCSEL), and the monitor 720 utilizes a single light-receiving site 724 according to one embodiment of the invention.

It is noted that the light-receiving site 724 can be implemented with any suitable geometric shape (e.g., a circle, square, polygon, or other shape). It is further noted that the monitor 720 can includes multiple light-receiving sites that can be implemented as separate islands (e.g., as two or more separate discontinuous regions or shapes) or as a single continuous shape.

The layout of the light monitor (e.g., photodetector) can include, but is not limited to, a layout that includes one or more disconnected or discontinuous islands, one or more continuous geometric shapes, a ring-like geometric shape, a ring-like geometric shape that includes at least one cutout, a layout that is symmetric about at least a first axis, a layout that is symmetric about a first axis and a second axis, and a layout that is radially symmetric. Moreover, the layout of the light monitor (e.g., photodetector) can include, for example, a single light-receiving site, at least two separate light-receiving sites, or four light-receiving sites. Examples of these geometries and configurations are described in greater detail hereinafter.

Figure 8:
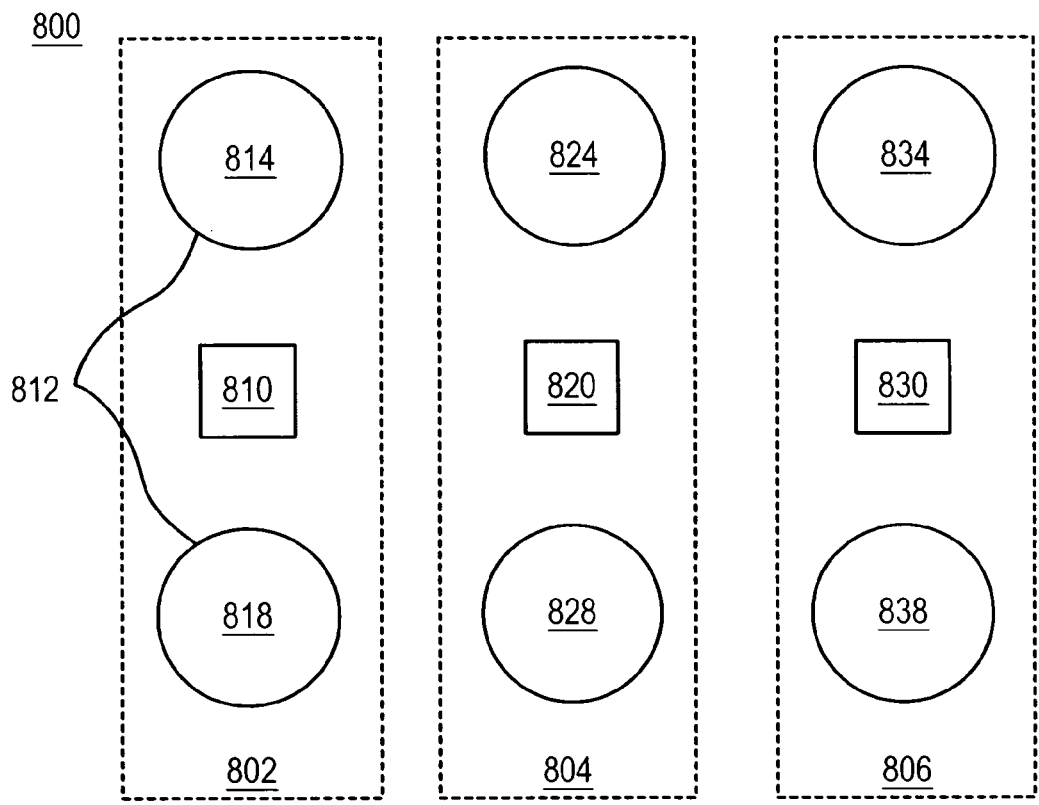
FIG. 8 illustrates a top view of an array of self-monitoring light sources, where each self-monitoring light source utilizes a layout with two light-receiving sites according to one embodiment of the invention.

FIG. 8 illustrates a top view of an array 800 of self-monitoring light sources (e.g., 802, 804, 806). Each self-monitoring light source includes a light source and a monitor integrated therewith. In this embodiment, the light sources (e.g., light sources 810, 820, 830) are semiconductor lasers (e.g., a VCSELs).

In this embodiment, each integrated monitor (e.g., monitor 812) utilizes two light-receiving sites. For example, the monitor 812 includes a first light receiving site 814 and a second light receiving sight 818. It is noted that the sites 814, 818 can be implemented with any suitable geometric shape (e.g., a circle, square, or other shape). It is further noted that the sites 814, 818 can be implemented as separate islands (e.g., as two or more separate discontinuous regions or shapes) or as a single continuous shape. An example of sites 814, 818 located on a single continuous shape (e.g., a ring-shape geometry) was described previously with reference to FIGS. 5 and 6.

This embodiment is particularly useful for those applications that require an array of lasers (e.g., an array of VCSELs), such as an array that includes a plurality of lasers (e.g., N lasers) arranged along a first dimension (e.g., an x-dimension or horizontal dimension). These lasers can be implemented with the self-monitoring light sources according to one embodiment of the invention.

It is noted that the layout of the monitor can be a layout that is symmetric about at least a first axis (e.g., an x-axis), a layout that is symmetric about a first axis (e.g., an x-axis) and a second axis (e.g., an y-axis), and a layout that is radially symmetric about a particular point. The layout of the monitor can also either partially or completely surround the laser aperture.

Exemplary Optical Element Configurations

The optical element according to one embodiment of the invention performs one or more of the following: collimating each received light beam to create a collimated light beam; reflecting the collimated light beam at an angle as a reflected light beam; partially transmitting the incident light beam as a transmitted light beam; partially deflecting the reflected light beam at an angle as a monitored light beam directly towards a light monitoring device; focusing the monitored light beam onto the light monitoring device; and focusing the transmitted light beam onto a fiber-optic cable.

In one embodiment, the optical element may be implemented with a grating (e.g., a diffractive grating).

Figure 9:
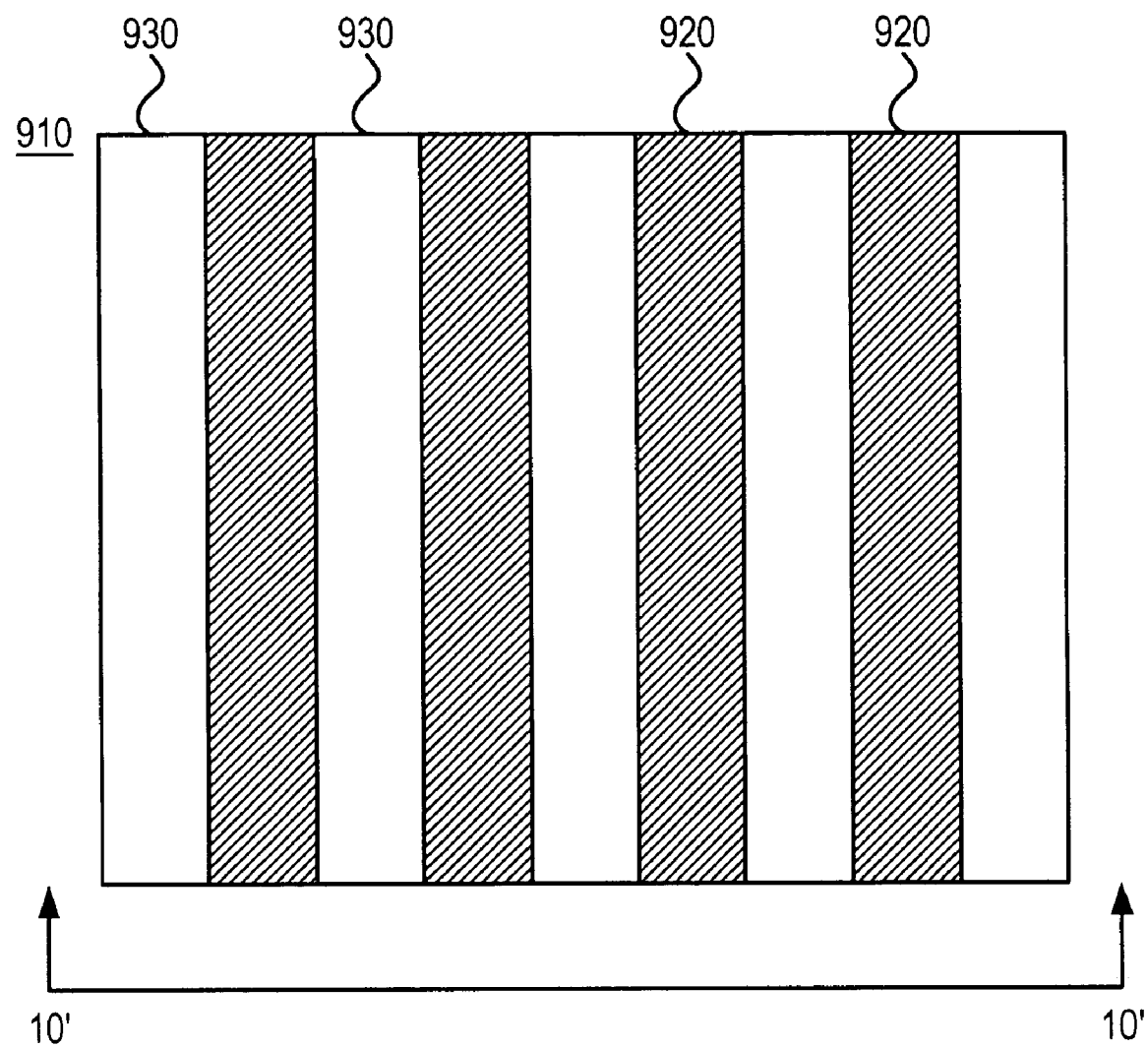
FIG. 9 illustrates a grating according to one embodiment of the invention.

FIG. 9 illustrates a top view of a grating 910 according to one embodiment of the invention. The grating 910 has a pattern, which is referred to as an alternating strip pattern. The grating 910 includes a plurality of ridge portions 920 and valley portions 930 that extend along a first axis (e.g., a vertical axis or y-axis). The ridge portions 920 and valley portions 930 alternate in occurrence as one moves from the left to the right. It is noted that the grating of FIG. 9 can be rotated by 90 degrees to realize a grating that has ridges and valleys that extend along a second axis (e.g., a horizontal axis or an x-axis) orthogonal to the first axis.

Figure 10:
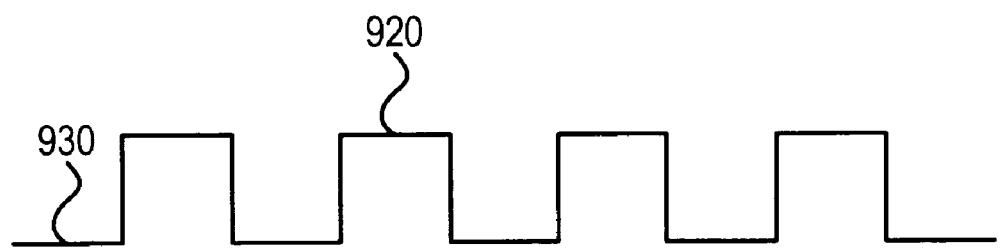
FIG. 10 illustrates a section view of FIG. 9 through line 10'-10'.

FIG. 10 illustrates a side view of a grating 910 of FIG. 9 through line 10'-10'. The grating 910 reflects back a portion of the light generated by the light source (e.g., laser) to two light-receiving sites, and consequently, would be suitable for incorporation with the self-monitoring light source with the layout illustrated in FIG. 8.

Figure 11:
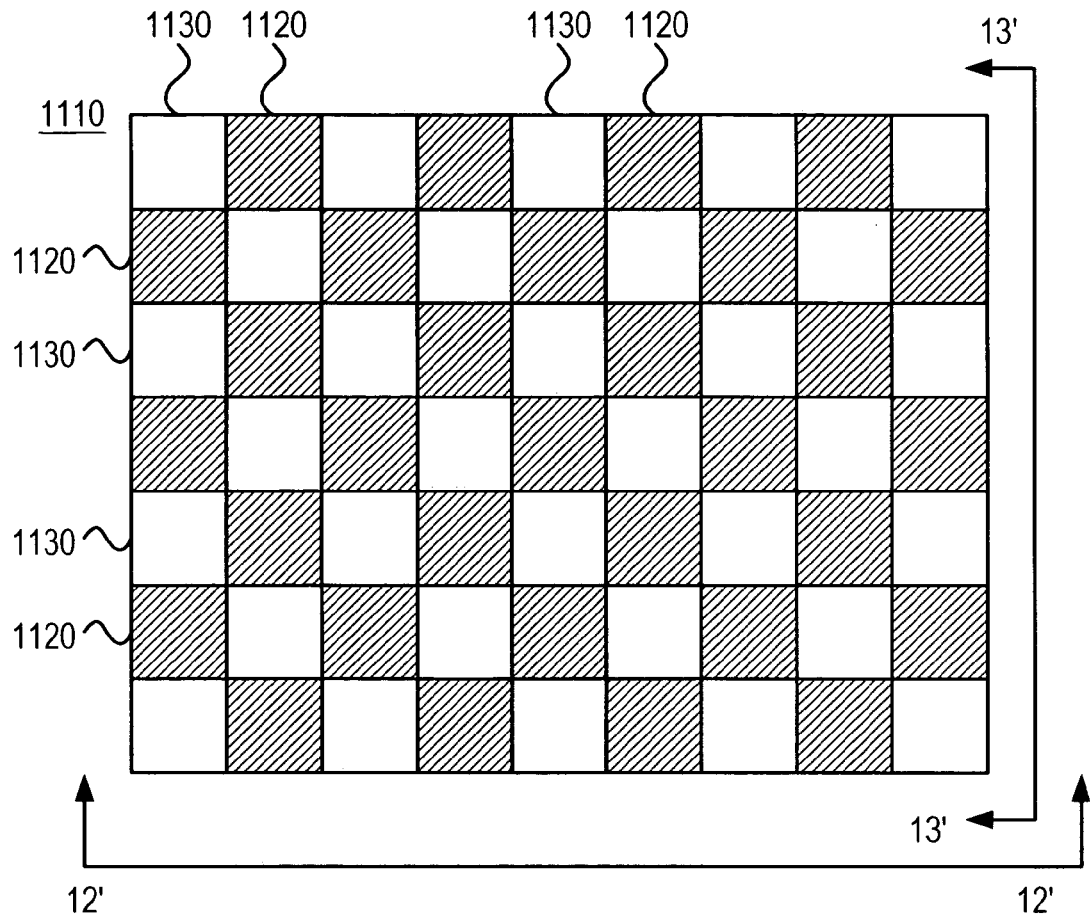
FIG. 11 illustrates a grating according to another embodiment of the invention.
Figure 12:
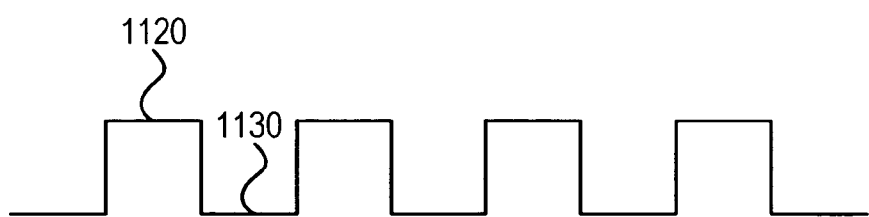
FIG. 12 illustrates a view of the grating of FIG. 11 through 12'-12'.
Figure 13:
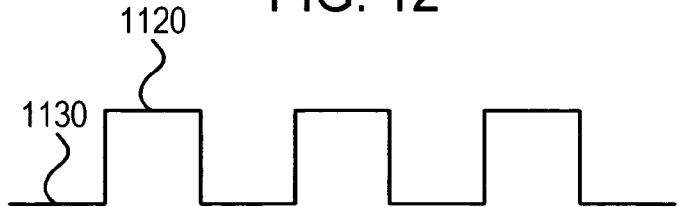
FIG. 13 illustrates a view of the grating of FIG. 11 through 13'-13'.

FIG. 11 illustrates a top view of a grating 1110 according to another embodiment of the invention. FIG. 12 illustrates a view of the grating 1110 through line 12'-12', and FIG. 13 illustrates a view of the grating 1110 through line 13'-13'. The grating 1110 has a pattern, which is referred to as a checkerboard pattern. The grating 1110 includes peak portions 1120 and floor portions 1130 that are arranged in a checkerboard fashion. The grating 1110 can be, for example, a two-dimensional crossed grating with identical periods and features along a first axis (e.g., horizontal direction) and a second axis (e.g., a vertical direction). The grating 1110 reflects back a portion of the light generated by the laser to four light-receiving sites, and consequently, would be suitable for incorporation with the self-monitoring light source with the layout illustrated in FIGS. 5 or 6.

In one embodiment, the grating 1110 with the checkerboard pattern has identical periods and features along a first axis and along a second axis. The period between identical features can be for example about 0.5 microns in one embodiment case and the period between identical features can be about 0.35 microns in another embodiment.

It is noted that processing a grating that has two heights (FIG. 9 and FIG. 11) is relatively simple for the processing techniques available to one of ordinary skill in the art.

Figure 14:
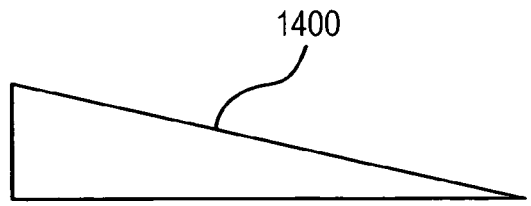
FIG. 14 illustrates a slanted grating suitable for generating a single region of light to be monitored according to yet another embodiment of the invention.

FIG. 14 illustrates a slanted grating 1400 suitable for generating a single region of light to be monitored according to yet another embodiment of the invention. This embodiment would be suitable for incorporation with the self-monitoring light source with the layout illustrated in FIG. 7.

Performance Plots and Illumination Pattern for a First Embodiment

Figure 15:
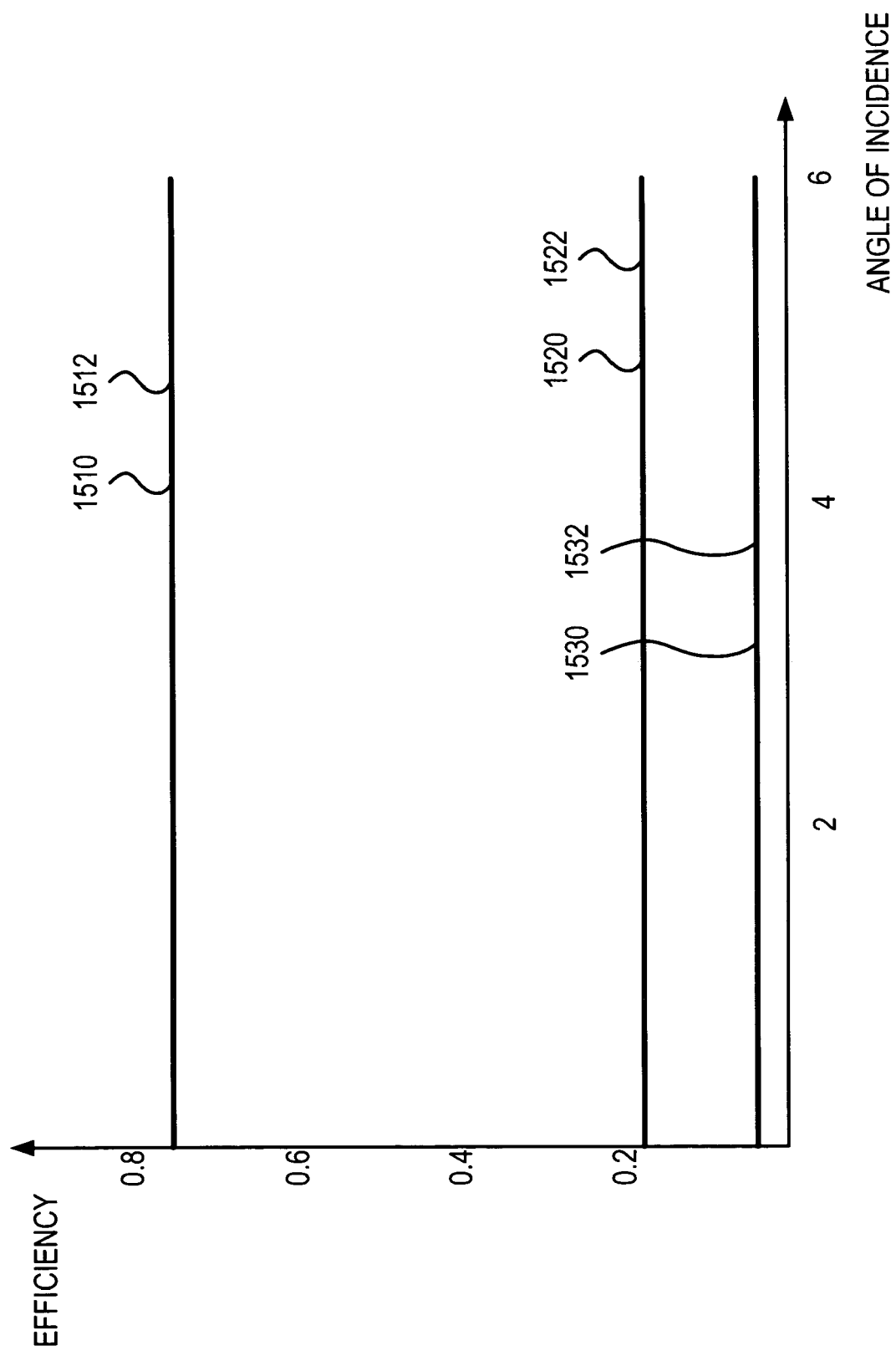
FIG. 15 illustrates a performance plot for a self-monitoring light source with a first monitor geometry according to one embodiment of the invention.

FIG. 15 illustrates a performance plot for an integrated laser/monitor with a first monitor geometry according to one embodiment of the invention. For a laser monitor to be reliable, the monitor should have a constant response to the light measured by the monitor. The monitor should be insensitive to the specific properties of the light (e.g., wavelength, angle of incidence, and polarization). Stated differently, the monitor response should vary due to changes in the total power received and not properties of the light, such as wavelength, polarization, and angle of incidence.

FIG. 15 illustrates as a function of polarization and angle of incidence the following: 1) a first plotline 1510 that represents the fraction of the laser power with a first polarization that is transmitted (for an application); a second plotline 1512 that represents the fraction of the laser power with a second polarization that is transmitted (for an application) 2) a third plotline 1520 that represents the fraction of the laser power with a first polarization that is reflected to the monitor (e.g., photodetector), and fourth plotline 1522 that represents the fraction of the laser power with a second polarization that is reflected to the monitor (e.g., photodetector) and 3) a fifth plotline 1530 that represents the fraction of the laser power with a first polarization that is reflected back towards the laser, and a sixth plotline 1532 that represents the fraction of the laser power with a second polarization that is reflected back to the laser aperture. The first polarization can be a TE polarization, and the second polarization can be a TM polarization. It is noted that plotlines 1510, 1520, and 1530 generally overlap plotlines 1512, 1522, and 1532, respectively.

It is noted that about 76% of the laser power is transmitted straight through the surface with no change, about 18% of the laser power is captured or measured by the monitor, and only about 3% of the laser power is reflected back towards the laser. Another 3% of the laser power (not accounted for in the above) is reflected to other spots that do not illuminate the monitor. It is noted that each plotline is generally insensitive to variations in wavelength for this application. For example, when the wavelength varies by plus or minus 20 nm, the plotline shows only insignificant variations.

In one embodiment, the grating period is about 0.50 um along the x direction and the y direction; the fill factor along the x direction and the y direction is about 0.5; the wavelength ($\gamma$) is about 0.98 um; the grating depth is about 87 nm, and an AR coating is utilized that is made from a material with an index of refraction of about 1.45.

As can be appreciated, FIG. 15 illustrates that there is no significant variation in response of the monitor due to changes in the properties of the laser beam. As the polarization and angle of the laser illumination changes, the power in each one of the four spots can vary; however, the variation of the individual spots offsets each other, and the summed power of the four spots remains relatively constant. The relative insensitivity of the monitor's response to polarization and angle of incidence is due to the two-dimensional grating design and the four light spots that are projected to the monitor.

Referring to FIG. 6, a light emitting device 620 and a monitor 610 that has a layout with a ring-shape geometry with cut-outs (e.g., a photo detector with a ring-shape geometry with cut-outs) are illustrated. FIG. 6 also provides an overlay of the optical spots that are reflected onto the device from the grating. The size of this self-monitoring laser design has a pitch of about 500 um between devices. A more compact spacing with a pitch of about 250 um can be realized by utilizing a one-dimensional grating that creates reflected spots along only one axis (e.g., perpendicular to a laser array) and would be suitable for an array of lasers.

In this embodiment, the die 604 has a size of about a 500 um square in which the monitor 610 can be implemented. There are nine light spots (630, 634, 638, 640, 644, 650, 654, 658, 660). The central spot 644 (about 3% of the total power) indicates the size and position of the undesirable reflection that returns to the location of the laser aperture. Although the central spot size has increased, only a small fraction of the reflected spot overlaps with the laser aperture.

There are four spots (630, 634, 638, 640) that are measured by the monitor 610 and provide the monitor signal (about 18% of the total power). There are also four extended elliptical spots (650, 654, 658, 660) (about 3% of the total power) on the diagonals that exist at higher angles, but are not collected by the monitor 610. To prevent these elliptical spots (650, 654, 658, 660) from being measured in the monitored power, areas or regions (e.g., cut-outs) of the ring geometry are removed.

Performance Plot and Illumination Pattern for a Second Embodiment

Figure 16:
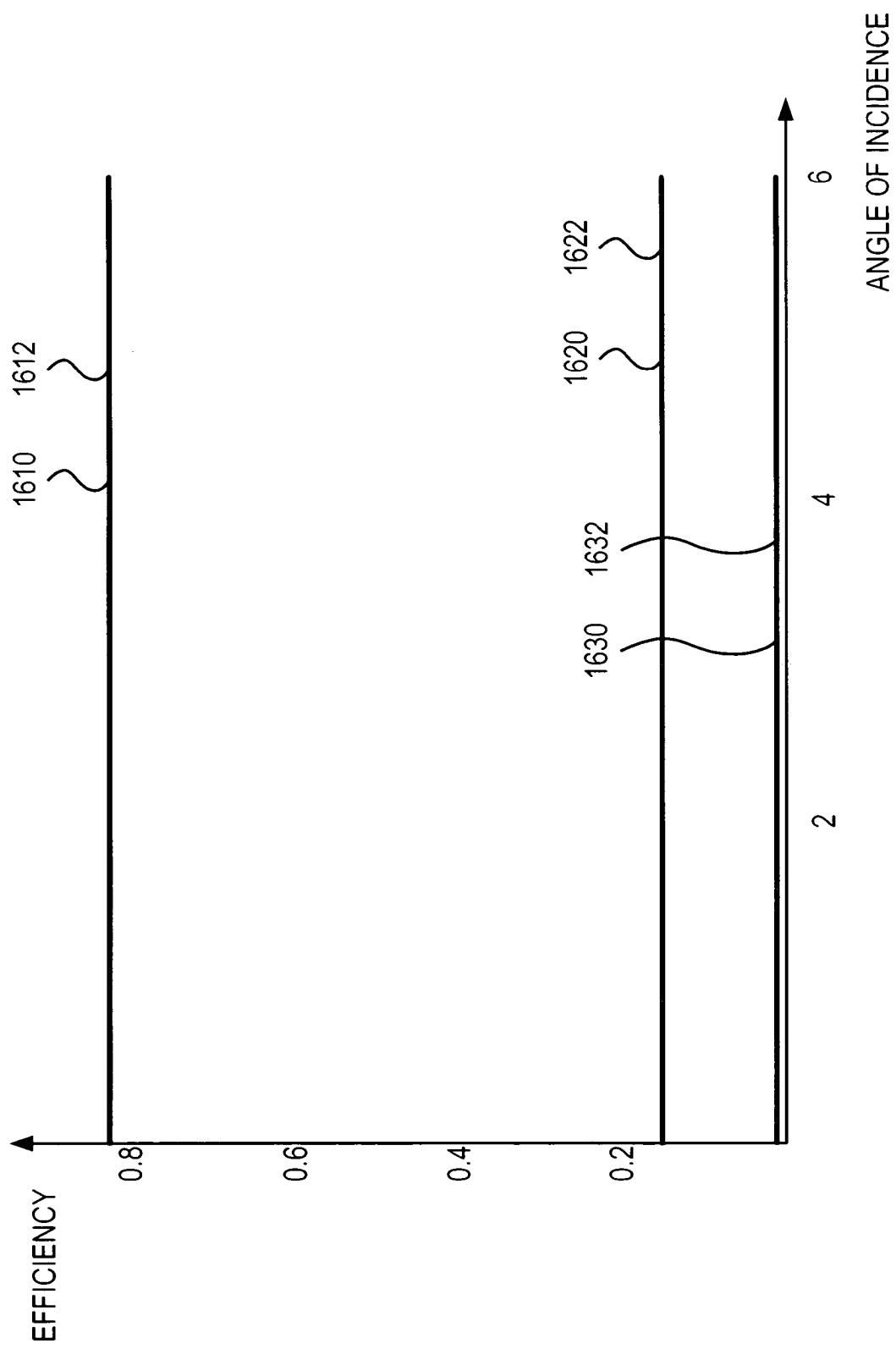
FIG. 16 illustrates a performance plot for a self-monitoring light source with a second monitor geometry according to one embodiment of the invention.

FIG. 16 illustrates a performance plot for an integrated laser/monitor with a second monitor geometry according to one embodiment of the invention. The second self-monitoring laser design differs from the first design in the following ways. First, the grating periods has been changed or adjusted to be smaller. In this design, the grating period is about 0.35 um. Second, the anti-reflection coating in the first design has been removed. Also, the grating etch depth is increased.

FIG. 16 illustrates as a function of polarization and angle of incidence the following: 1) a first plotline 1610 that represents the fraction of the laser power with a first polarization that is transmitted (for an application); a second plotline 1612 that represents the fraction of the laser power with a second polarization that is transmitted (for an application); 2) a third plotline 1620 that represents the fraction of the laser power with a first polarization that is reflected to the monitor (e.g., photodetector); a fourth plotline 1622 that represents the fraction of the laser power with a second polarization that is reflected to the monitor (e.g., photodetector); and 3) a fifth plotline 1630 that represents the fraction of the laser power with a first polarization that is reflected back to the laser; a sixth plotline 1632 that represents the fraction of the laser power with a second polarization that is reflected back to the laser. The first polarization can be a TE polarization, and the second polarization can be a TM polarization. It is noted that plotlines 1610, 1620, and 1630 generally overlap plotlines 1612, 1622, and 1632, respectively.

In this embodiment, the fraction of the transmitted power has been increased to about 82%, and the fraction of monitored power is about 16%. About 2% of the total power is unwanted feedback reflection. This particular monitor design also exhibits good insensitivity to beam polarization and angle of incidence. The sum of the power in this example adds to 100% (i.e., all the power is accounted for).

The smaller grating period produces only 5 reflected spots (see FIG. 5), and there are no extra spots to expend power from the system. It is noted that in one embodiment of the invention the four monitoring spots that are created propagate at higher angles, thereby leading to a photodetector ring with a larger geometry and an overall larger die size. In this example, the die size is about 1000 um on each edge.

It is noted that the light is reflected from the grating is diffracted into five main spots (530, 540, 550, 560 and 570) that are projected back down to the rear surface of the VCSEL die. Four spots (530, 540, 550, and 560) are projected out radially from the laser aperture and are located at intervals of about 90 degrees around the circle. These four spots (530, 540, 550 and 560) each illuminate a part of the ring-shaped monitor 510 (e.g., photo detector with a layout having a ring-shaped geometry). When the received-light at these four spots are summed together, the sum represents the total power incident on the monitor 510. The fifth spot 570 reflects straight down from the grating surface and sends some power back towards the laser. As this power can cause a de-stabilizing feedback, this fifth spot 570 should be minimized to avoid the feedback problems.

In one embodiment, the grating period is about 0.35 um along the x direction and the y direction; the fill factor along the x direction and the y direction is about 0.5; the wavelength ($\gamma$) is about 0.98 um; the grating depth is about 132 nm, and there is no AR coating. It is noted that each plotline is generally insensitive to practical variations in wavelength for this application. For example, when the wavelength varies by plus or minus 20 nm, the plotline shows only insignificant variations.

The use of the self-monitoring laser according to the invention is generally transparent to the platform design of a product. Electrical contacts (e.g., a set of electrodes) may be needed to operate the monitor (e.g., photodetector) in addition to the usual electrical contacts to provide power to the die, to provide laser drive signals. These extra contacts can be used to communicate monitor signals (e.g., total power measured by the monitor).

Figure 17:
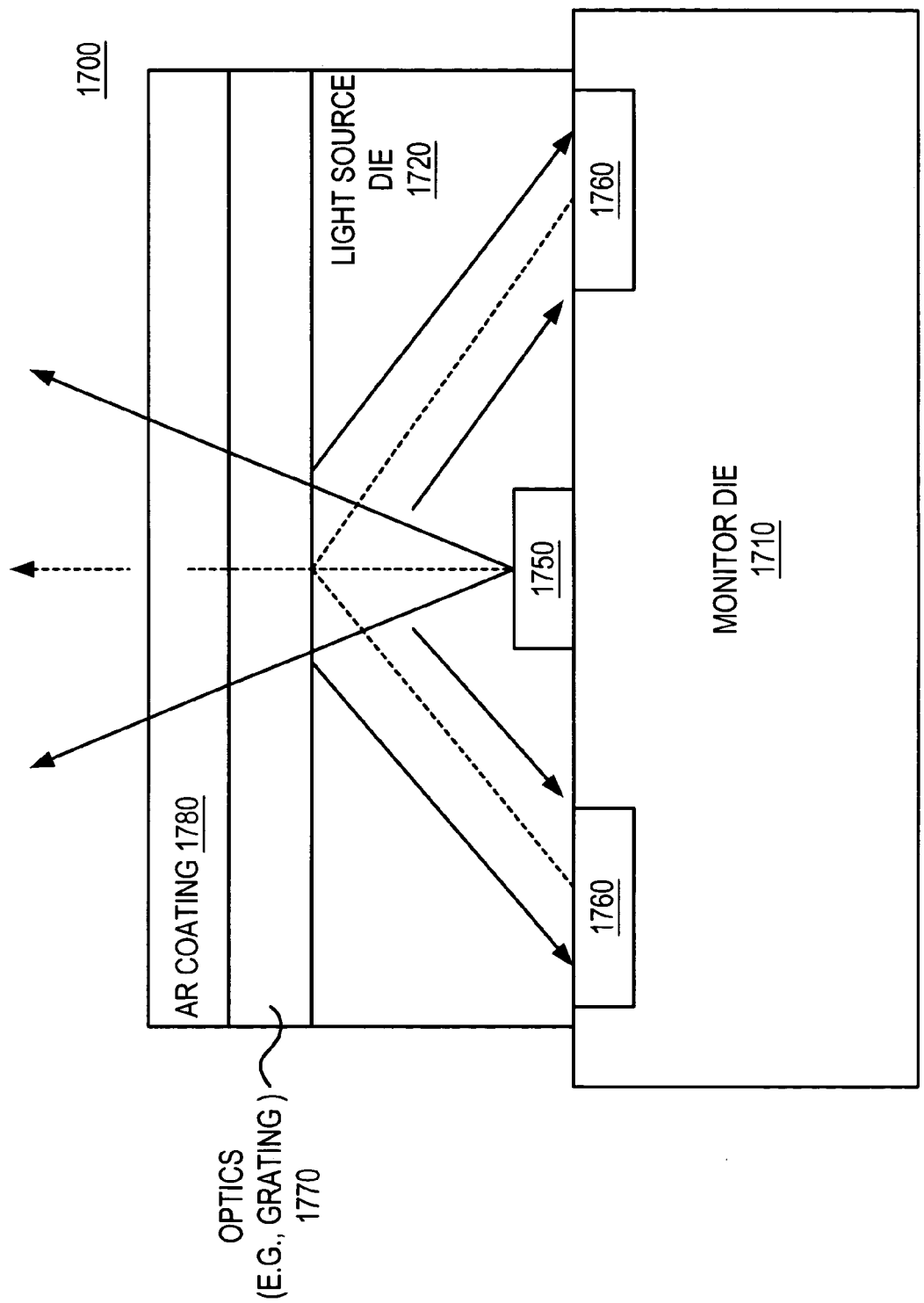
FIG. 17 illustrates a self-monitoring light source in which a monitor is formed in a monitor die, a light source is formed in a light source die, and the monitor die and the light source die are combined into a single sub-assembly according to one embodiment of the invention.

FIG. 17 illustrates a self-monitoring light source 1700 in which a monitor 1760 is formed in a monitor die 1710, a light source 1750 is formed in a light source die 1720, and the monitor die 1710 and the light source die 1720 are combined into a single sub-assembly according to one embodiment of the invention. In this embodiment, the light source 1750 (e.g., VCSEL) is formed or manufactured in the VCSEL die 1720. The monitor 1760 is formed or manufactured in a monitor die 1710 that is separate from the VCSEL die 1720. According to one embodiment of the invention, the monitor die 1710 is formed as a separate element underneath the laser die 1720. The monitor die 1710 and VCSEL die 1720 may be combined into a single sub-assembly by using the following process. First, at least one electrical contact (e.g., a bump made from a conductive material, an electrode, or conductive pad) is formed in the monitor die. Second, the VCSEL die is positioned onto the electrical contact. The VCSEL die includes at least one electrical contact for electrically coupling with the electrical contact of the monitor die. Next, the gap between the VCSEL die and the monitor die may be under-filled with an adhesive material, such as a high index epoxy. It is noted that one or more electrical traces may be provided in the monitor die or light source die to route electrical signals. An optical element (e.g., grating) 1770 may be formed on the light source die (e.g., VCSEL die) 1720. An anti-reflection (AR) coating may be optionally deposited over the optical element 1770.

Figure 18:
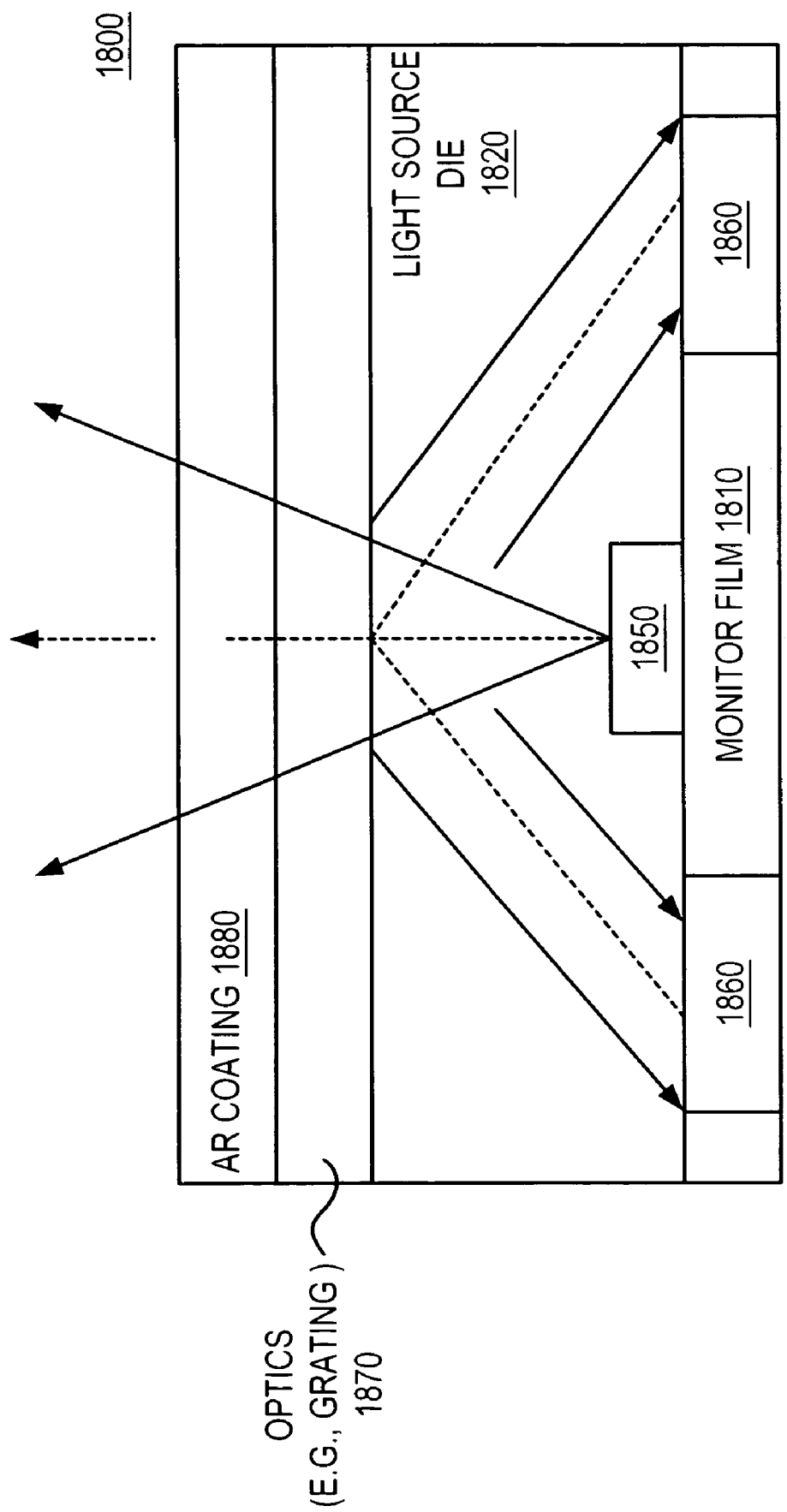
FIG. 18 illustrates a self-monitoring light source in which the monitor is implemented as a surface treatment according to one embodiment of the invention.

FIG. 18 illustrates a self-monitoring light source 1800 according to one embodiment of the invention where the light monitor 1860 is implemented as a surface treatment (e.g., a monitor film 1820). In this embodiment, the light source 1850 (e.g., VCSEL) is formed or manufactured in the light source die 1820, and the monitor 1860 is formed or manufactured in the monitor film 1820. An optical element (e.g., grating) 1870 may be formed in the light source die 1820 (e.g., on a surface in the VCSEL die). An anti-reflection (AR) coating 1880 may be optionally deposited over the optical element (e.g., grating) 1870.

Figure 19:
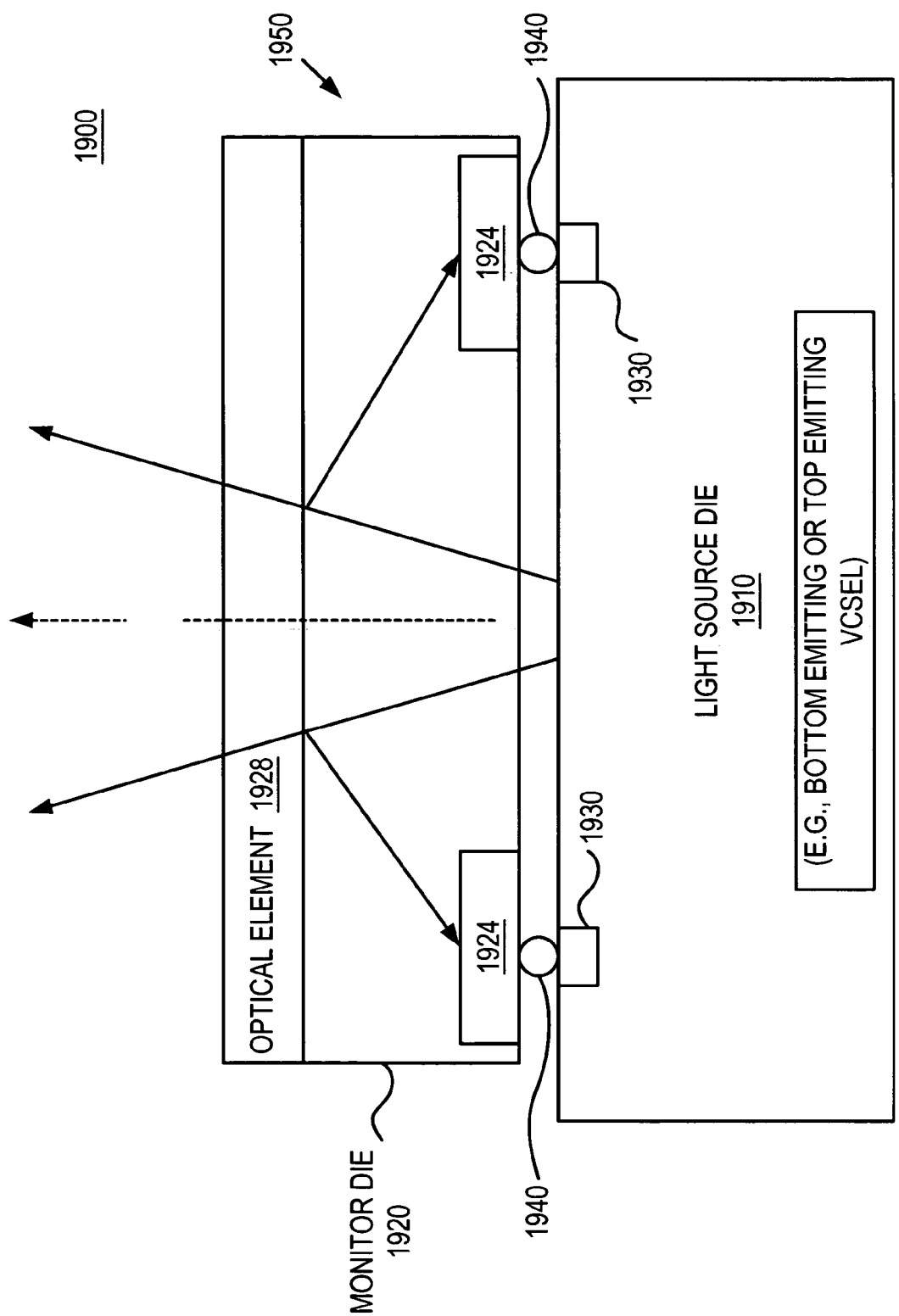
FIG. 19 illustrates a self-monitoring light source in which an optical element is integrated with a monitor die and the monitor die is combined with a light source die to form a single sub-assembly according to one embodiment of the invention.

FIG. 19 illustrates a self-monitoring light source 1900 in which an optical element 1928 is integrated with a monitor die 1920 and the monitor die 1920 is combined with a light source die 1910 to form a single sub-assembly 1950 according to one embodiment of the invention. The self-monitoring light source 1900 includes a light source die 1910 in which a vertical emitting light source may be formed or manufactured. The self-monitoring light source 1900 also includes a monitor die 1920 in which a light monitor 1924 (e.g., a photodetector) is formed. The light source die 1910, for example, can include a bottom emitting VCSEL, a top emitting VCSEL or vertical emitting light emitting diode (LED). The monitor die 1920 can include a monitor 1924 with a ring-shape geometry or other geometries and layouts described previously.

It is noted that in this embodiment, an optical element 1928 (e.g., a grating) is integrated with the monitor die (e.g., formed on a surface of the monitor die 1920). The monitor die 1920 is combined (e.g., assembled or packaged) with the light source die 1910 to form a single sub-assembly 1950. The monitor die 1920 and the light source die 1910 may be electrically coupled through the use of one or more electrical contacts 1930 formed in the light source die 1910 and one or more electrical contacts 1940 formed in the monitor die 1920. Electrical traces may also be provided in either the monitor die 1920, light source die 1910, or both to conduct electrical signals within each die, between die, and into or out of the sub-assembly 1950.

It is noted that according to other embodiments of the invention, the self-monitoring light emitting apparatus includes a light source, monitor, and optical element; and any combination of two of the three components are integrated in a first die, a third component is formed in a second die, and the first die and the second die are combined (e.g., assembled or packaged) into a single sub-assembly. In this manner, the three components (e.g., light source, monitor, and optical element) of the self-monitoring light emitting apparatus according to various embodiments of the invention can be integrated or assembled with different combinations and with different levels of integration. In one example, a vertical emitting light source (e.g., a VCSEL), a light monitor (e.g., light detector), and optics (e.g., diffraction grating) may be combined or assembled together into a single sub-assembly by integrating two of the above-noted components and forming the two components in a first die, forming a third component in a second die, and assembling or packaging the first die and the second die into a single sub-assembly.

Embodiments of self-monitoring light emitting apparatus that monitor the output power of a light source (e.g., a semiconductor laser) have been described. By integrating a light monitor with the light source in either a single semiconductor die or in a single sub-assembly, the output power of the light source (e.g., a VCSEL) may be monitored. In another embodiment, the optics required to reflect light back to the monitor is also integrated into either the single semiconductor die (e.g., VCSEL die) or the single sub-assembly. The optics may also be integrated into a light source die or into a monitor die. The integration of the optics into either the monitor die, light source die, or single semiconductor die according to the different embodiments of the invention simplifies platform design, requires fewer piece parts than the prior art solutions, requires less alignment, avoids assembly and packaging issues required by prior art solutions, and offers a more compact solution than prior art approaches.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A self-monitoring light source comprising:
    a light source fabricated in a semiconductor die, the light source generating light;
    a light monitor fabricated in the same semiconductor die as the light source, the light monitor being laterally displaced from the light source in the semiconductor die so the light monitor is not directly above or below the light source;
    an optical element above the light source, the optical element being distinct from the light source, the optical element directing a portion of the light from the light source to the light monitor so the light monitor generates a feedback signal;
    wherein the light source is a VCSEL that includes an aperture;
    wherein the light monitor includes a ring-shape layout that at least partially surrounds the aperture.

2. A self-monitoring light source comprising:
    a light source fabricated in a semiconductor die, the light source generating light;
    a light monitor fabricated in the same semiconductor die as the light source, the light monitor being laterally displaced from the light source in the semiconductor die so the light monitor is not directly above or below the light source;

an optical element above the light source, the optical element being distinct from the light source, the optical element directing a portion of the light from the light source to the light monitor so the light monitor generates a feedback signal;

wherein the light monitor includes a layout with a light-receiving site; and wherein the light monitor includes one of a ring-shape geometry, a ring-shape geometry that includes at least one cutout, a layout that is symmetric about at least a first axis, a layout that is symmetric about a first axis and a second axis, and a layout that is radially symmetric.

3. A self-monitoring light source comprising:

a light source fabricated in a semiconductor die, the light source generating light;

a light monitor fabricated in the same semiconductor die as the light source, the light monitor being laterally displaced from the light source in the semiconductor die so the light monitor is not directly above or below the light source;

an optical element above the light source, the optical element being distinct from the light source, the optical element directing a portion of the light from the light source to the light monitor so the light monitor generates a feedback signal;

wherein the optical element is formed in the semiconductor die and the light source is a bottom surface emitting VCSEL.

4. A self-monitoring light emitting apparatus comprising:

a vertical emitting light source that generates light; wherein the vertical emitting light source is formed in a light source die;

a monitor that receives a portion of the generated light;

an optical element that is formed in the monitor die and that directs a portion of the generated light to the monitor;

wherein the monitor is formed in a monitor die and laterally displaced from the vertical emitting light source so the monitor is not directly above or below the vertical emitting light source;

wherein the light source die and the monitor die are combined into a single sub-assembly.

5. The self-monitoring light emitting apparatus of claim 4 wherein the monitor die includes a surface; and wherein the optical element is a grating that is formed on the surface of the monitor die.

6. A self-monitoring light emitting apparatus comprising:

a vertical emitting light source that generates light; wherein the vertical emitting light source is formed in a light source die;

a monitor that receives a portion of the generated light;

an optical element that is formed in the light source die and that directs a portion of the generated light to the monitor;

wherein the monitor is formed in a monitor die and laterally displaced from the vertical emitting light source so the monitor is not directly above or below the vertical emitting light source;

wherein the light source die and the monitor die are combined into a single sub-assembly.

7. The self-monitoring light emitting apparatus of claim 6 wherein the light source die includes a surface; and wherein the optical element is a grating that is formed on the surface of the light source die.

8. A self-monitoring light emitting apparatus comprising:

a vertical emitting light source that generates light; wherein the vertical emitting light source is formed in a light source die;

a monitor that receives a portion of the generated light;

wherein the monitor is formed in a monitor die and laterally displaced from the vertical emitting light source so the monitor is not directly above or below the vertical emitting light source;

wherein the light source die and the monitor die are combined into a single sub-assembly;

wherein the monitor includes a light-receiving site; and wherein the monitor includes one of a ring-shape geometry, a ring-shape geometry that includes at least one cutout, a layout that is symmetric about at least a first axis, a layout that is symmetric about a first axis and a second axis, and a layout that is radially symmetric.

9. A light emitting apparatus comprising:

a light source that is formed in a light source die and that generates light;

wherein the light source die includes a surface;

an optical element that is formed in the surface of the light source die, the optical element being distinct from the light source, the optical element selectively transmitting a portion of the generated light and reflects a portion of the generated light; and a light monitor that is formed in one of a light monitor die and a thin film and that receives at least a portion of the reflected light;

wherein the light monitor die is combined with the light source die into a single sub-assembly.

10. A light emitting apparatus comprising:

a light source that is formed in a light source die and that generates light;

wherein the light source die includes a surface; and an optical element that is formed in the surface of the light source die, the optical element being distinct from the light source, the optical element selectively transmitting a portion of the generated light and reflects a portion of the generated light;

wherein the optical element includes a grating with an alternating strip pattern.

11. A light emitting apparatus comprising:

a light source that is formed in a light source die and that generates light;

a light monitor that is formed in a light monitor die that includes a surface; and an optical element that is formed in the surface of the light monitor die and that selectively transmits a portion of the light incident thereto and reflects a portion of the incident light;

wherein the light monitor die is combined with the light source die into a single sub-assembly, the light monitor is laterally displaced from the light source so the light monitor is not directly above or below the light source.

12. The apparatus of claim 11 wherein the light source is one of a vertical emitting light source, a bottom surface emitting VCSEL, a top surface emitting VCSEL, a vertical emitting semiconductor laser, and a vertical emitting light emitting diode.

13. The apparatus of claim 11 wherein the optical element includes a grating with an alternating strip pattern.

* * * * *